US009883610B1

(12) United States Patent
Beall et al.

(10) Patent No.: US 9,883,610 B1
(45) Date of Patent: Jan. 30, 2018

(54) ELECTRONIC DEVICE FILTER DOOR

(71) Applicant: Amazon Technologies, Inc., Seattle, WA (US)

(72) Inventors: Christopher Strickland Beall, Woodinville, WA (US); Frank Charles Paterra, Kirkland, WA (US); Darin Lee Frink, Lake Tapps, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/280,644

(22) Filed: Sep. 29, 2016

(51) Int. Cl.
*H05K 7/20* (2006.01)
*H05K 5/00* (2006.01)
*H05K 5/03* (2006.01)

(52) U.S. Cl.
CPC ....... *H05K 7/20181* (2013.01); *H05K 5/0017* (2013.01); *H05K 5/03* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723, 361/699–704, 709–710, 719–721, 756, 361/741, 686, 687, 679.01–679.45, 361/679.55–679.61, 724–727, 787, 789; 165/80.1–80.5, 104.33, 185; 174/15.1–15.3, 16.1–16.3, 547, 548; 257/712–722, E23.088; 24/453, 458–459; 454/184; 312/236; 349/56–60; 348/787, 348/789, 794
See application file for complete search history.

(56) References Cited

U.S. PATENT DOCUMENTS

| | | | | |
|---|---|---|---|---|
| 2003/0039094 | A1* | 2/2003 | Sarkinen | H05K 5/0017 361/679.27 |
| 2005/0047067 | A1* | 3/2005 | Bang | H05K 7/20963 361/679.21 |
| 2005/0185374 | A1* | 8/2005 | Wendel | G11B 33/08 361/679.33 |
| 2009/0015997 | A1* | 1/2009 | Barajas | G09F 9/33 361/679.27 |
| 2012/0194971 | A1* | 8/2012 | Marker | H05K 5/0004 361/679.01 |
| 2012/0307435 | A1* | 12/2012 | Ogawa | F16M 7/00 361/679.01 |

(Continued)

*Primary Examiner* — Anthony Haughton
*Assistant Examiner* — Razmeen Gafur
(74) *Attorney, Agent, or Firm* — Lee & Hayes, PLLC (57) ABSTRACT

An electronic device may include a door filter that is moveable to transition between a first position that enables visibility of a display located behind or underneath the filter and a second position that causes air entering the electronic device to pass through an air filter. In some embodiments, the door filter may be moveable or rotatable relative to a door filter frame that is removably coupled to an electronic device housing and located over an aperture in the electronic device housing. The door filter may include a first portion that couples to a second portion to secure or at least partially enclose the air filter. When the door filter frame is decoupled from the electronic device, a security door may close the aperture by engaging the same coupling points in the electronic device housing as previously engaged by the door filter frame.

20 Claims, 12 Drawing Sheets

(56) References Cited

U.S. PATENT DOCUMENTS

| | | | | |
|---|---|---|---|---|
| 2013/0003273 A1* | 1/2013 | Takechi | ............ | G02F 1/133308 361/679.01 |
| 2013/0003286 A1* | 1/2013 | Abe | ........................ | A63F 13/08 361/679.31 |
| 2013/0057785 A1* | 3/2013 | Hiratomo | ............ | H04M 1/0202 348/843 |
| 2013/0070409 A1* | 3/2013 | Hoss | ........................ | G06F 1/20 361/679.31 |
| 2013/0088820 A1* | 4/2013 | Kuroda | ................ | H05K 5/0017 361/679.01 |
| 2013/0128439 A1* | 5/2013 | Walters | ................ | G06F 1/1641 361/679.04 |
| 2013/0258567 A1* | 10/2013 | Eul | ..................... | B60R 11/0264 361/679.01 |
| 2013/0277930 A1* | 10/2013 | Ergun | .................. | G06F 1/1607 280/47.35 |
| 2013/0279106 A1* | 10/2013 | Ergun | .................. | G06F 1/1607 361/679.26 |
| 2013/0279109 A1* | 10/2013 | Lindblad | ................ | G06F 1/1607 361/679.43 |
| 2013/0301203 A1* | 11/2013 | Kameda | ................. | G06F 1/1601 361/679.21 |
| 2013/0308250 A1* | 11/2013 | Chiu | ....................... | G09F 27/00 361/679.01 |
| 2014/0029178 A1* | 1/2014 | Trudeau, Jr. | ............. | H05K 7/02 361/679.01 |
| 2014/0340828 A1* | 11/2014 | Truong | ................. | G06F 1/1601 361/679.22 |
| 2015/0160696 A1* | 6/2015 | Lauder | ...................... | H01F 7/04 361/679.56 |
| 2015/0205327 A1* | 7/2015 | Daley, III | ............. | G06F 1/1698 361/679.03 |
| 2015/0216060 A1* | 7/2015 | Saitou | ..................... | E02F 3/325 349/58 |
| 2015/0280410 A1* | 10/2015 | Elberbaum | .............. | H02G 3/18 361/679.01 |
| 2015/0301778 A1* | 10/2015 | Lim | ........................ | G06F 3/147 361/679.21 |

\* cited by examiner

Section A-A

FIG. 3A

Section A-A

Section B-B
FIG. 11B

FIG. 12

ELECTRONIC DEVICE FILTER DOOR

BACKGROUND

Compact electronic devices often generate heat during operation. Often, these devices utilize thermal devices, such as fins and heat sinks to remove head from certain components. Some systems use fans to move air across or through components to remove heat from the components or to remove heat from the device. When a device is used in dirty environments, such as in a dusty location or other location where air quality is poor, it may be desirable to filter air before the air enters the device.

Many devices use a relatively compact form-factor to minimize cost of the device, to reduce an overall footprint of the device, for aesthetic reasons, and/or for other reasons. To accommodate a compact form-factor, some components in a device may be required to perform multiple functions to reduce an overall number of parts of the device.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

FIGS. 3A and 3B show a cross-sectional side elevation view of the electronic device showing airflow of a cooling system of the electronic device that moves air through the removable door filter and through the electric device.

FIGS. 5A-E show the door filter assembly.

FIGS. 6A-E show the door filter frame.

FIGS. 7A-E show the door filter casing. FIG. 7A is a pictorial view, FIG. 7B is a top plan view, FIG. 7C is a right side elevation view, FIG. 7D front elevation view and FIG. 7E is a back elevation view.

FIGS. 9A and 9B show an illustrative optical indicator component to facilitate providing messages to a user of the electronic device.

FIGS. 10A and 10B show an illustrative door filter casing that includes an aperture to provide at least partial visibility to a display of the electronic device.

FIGS. 11A and 11B show an electronic device with a stowable door filter and stowable security door, which each stow in the electronic device housing.

DETAILED DESCRIPTION

This disclosure is directed to an electronic device that includes a door filter that is moveable to transition between a first position that enables visibility of a display located behind or underneath the filter and a second position that causes air entering the electronic device to pass through an air filter. In some embodiments, the door filter may be moveable relative to a door filter frame that is removably coupled to an electronic device housing and located over an aperture in the electronic device housing. The door filter may include a first portion that couples to a second portion to secure or at least partially enclose the air filter. When the door filter frame is decoupled from the electronic device, a security door may close the aperture by engaging the same coupling points in the electronic device housing as previously engaged by the door filter frame.

In some embodiments, the door filter may include a display aperture to enable view of at least a portion of the display while the door filter is in the second position. In various embodiments, the door filter may include an optical indicator component that extends through the air filter and the door filter to enable light from the display to be projected outside of the door filter while the door filter casing is located in the second position.

The apparatuses, techniques, and systems described herein may be implemented in a number of ways. Example implementations are provided below with reference to the following figures.

Figure 1:
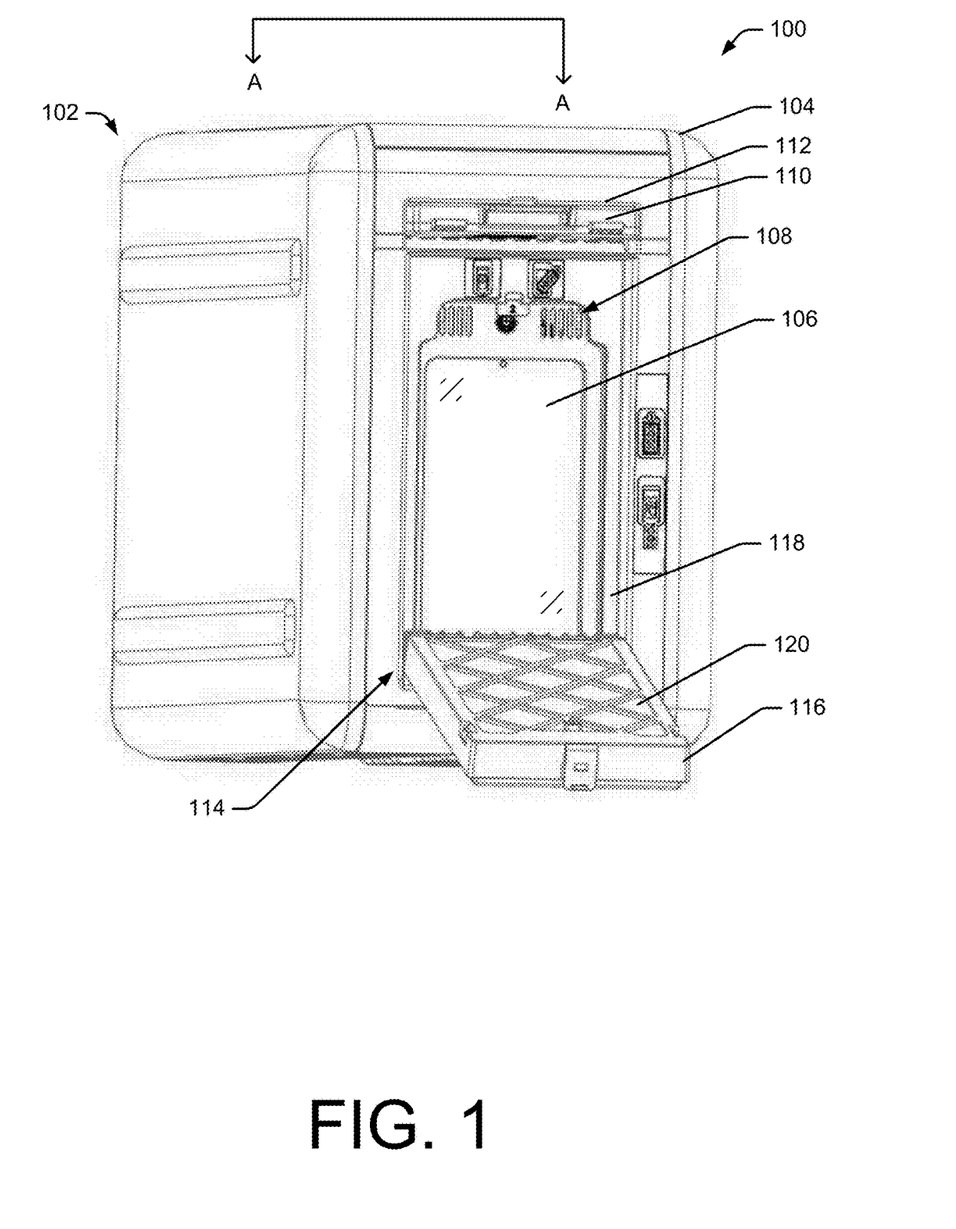
FIG. 1 perspective view of an illustrative electronic device housing assembly of an electronic device that includes a removable door filter and security door configured to cover a display and an aperture of the electronic device housing.

FIG. 1 perspective view of an illustrative electronic device housing assembly 100 of an electronic device 102. The electronic device 102 may be used to store and physically move large amounts of customer data off of customer storage networks or servers to other storage networks or servers, when other forms of transfer (e.g., broadband data transmission) are unavailable or cost or time prohibitive, for example. The electronic device 102 include an electronic device housing 104 (or simply "housing").

The electronic device 102 may include a display 106 that is at least partially recessed in an aperture 108, such as to enable a security door to enclose the electronic device 102 and cover the display 106. The display 106 may be a touch screen display configured to receive user input via controls displayed by the display 106. However, more or other controls may also be used, which may reside on practically any portion or surface of the electronic device 102. Besides enabling view of the display 106, the aperture 108 may enable air to be drawn into the electronic device 102 to remove heat from components. For example, a fan may be used to pull air into the electronic device 102 via the aperture 108. The air may flow around the display 106 as the air enters the electronic device through the aperture 108.

The electronic device housing assembly 100 may include a security door 110 configured to cover the display 106 and the aperture 108 of the electronic device 102. The security door 110 may move between a closed position to cover the aperture 108 when the electronic device 102 is configured for a shipment or not in use, and a stowed position where the security door 110 is stowed in a cavity 112 in the electronic device housing 104. When the security door 110 is in the stowed position, air may enter the electronic device 102 via the aperture 108. The security door 110, when closed, may prevent unauthorized access to the display 106, protect internal components from damage and/or user manipulation, prevent air, dirt, and/or other unwanted debris to enter the electronic device, and/or or may have other utility.

The electronic device housing assembly 100 includes a removable door filter assembly 114. The removable door filter assembly may include a door filter case 116 that is movable relative to, and is coupled to, a door filter frame 118. The door filter case may include an air filter 120 to filter air flowing into the electronic device 102. The door filter assembly 114 may selectively couple to the aperture 108 when the security door 110 is in the stowed position. For example, the door filter frame 118 may be selectively coupled to the electronic device housing 104 by engaging at least one feature also used to secure the security door 110 when the security door 110 is in the closed position. The door filter casing 116 may be configured to rotate between a first position to reveal the display 106 (e.g., allow a user to view the display) and a second position to cover the aperture 108 with the air filter 120 to filter air flowing into the electronic device 102. Movement of the various devices is described further with reference to FIG. 2.

Figure 2:
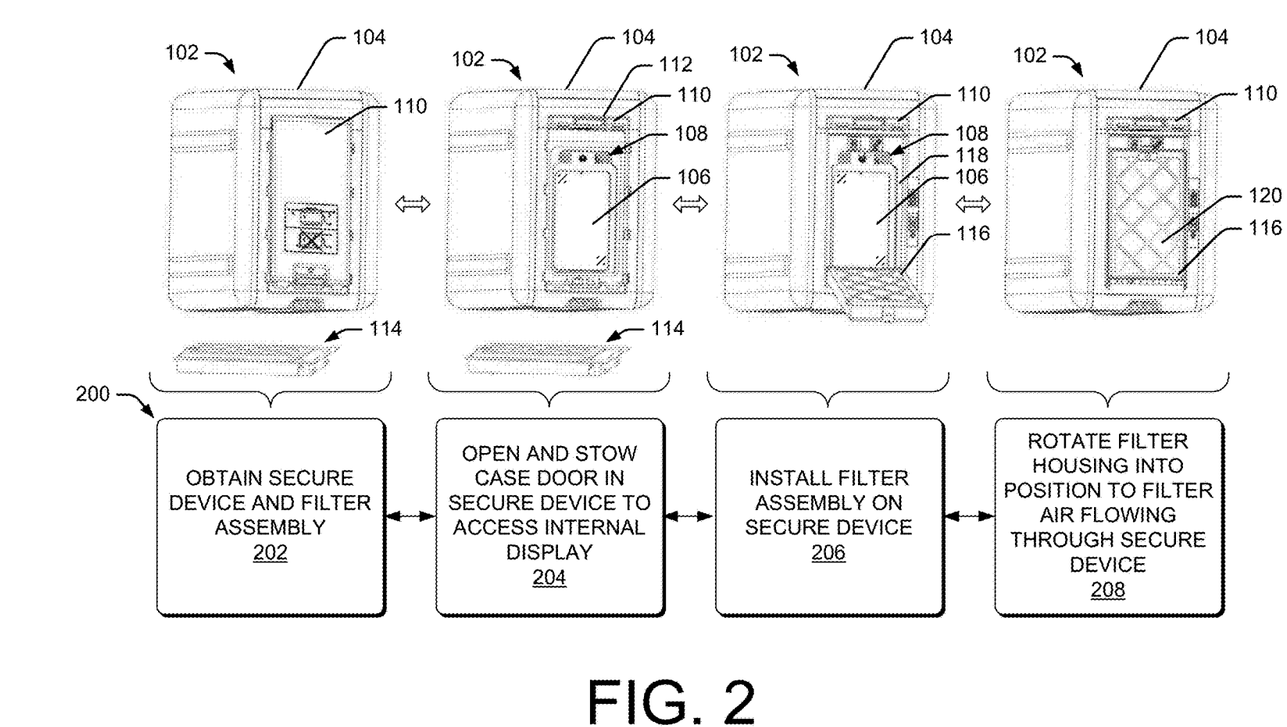
FIG. 2 is a pictorial flow diagram showing an illustrative process of use of the removable door filter with the electronic device housing.

FIG. 2 is a pictorial flow diagram showing an illustrative process 200 of use of the removable door filter with the electronic device housing. The process 200 shows various operations which can be traversed in either "direction" to add the air filter 120 and/or to secure the electronic device 102 for shipping, even though the process 200 is explained in only one direction.

At 202, the electronic device 102 may be obtained along with the door filter assembly 114, which may be decoupled from the electronic device 102 at this time. The electronic device 102 may be in a secured configuration for shipment, which may include the security door 110 being in a closed position to cover and protect the display 106 and to cover the aperture 108. Upon receipt of the electronic device 102 in the secure configuration, a recipient may unlock the security door 110.

At 204, the security door 110 may be opened and stowed in the stowed position in the cavity 112 of the electronic device housing 104. To open the security door 110, a feature of the security door 110 may be uncoupled from a corresponding feature of the electronic device housing. In some embodiments, the security door 110 may be coupled to the electronic device housing 104 and may not be completely detached from the electronic device housing 104. The security door 110 may rotate approximate ninety degrees or another angle range to transition from the closed position to the stowed position, and may traverse into the electronic device housing 104 into the cavity 112. After opening the security door 110, the display 106 may be visible to a user and ready for user interaction. In some embodiments, the display's operation may be subject or conditioned upon the security door being in the stowed position, such as when a sensor is used to determine that the security door 110 is in the stowed position. In addition, after opening the security door 110, aperture 108 may enable air to flow through the electronic device 102, possibly as a result of a draw of air caused by activation of a fan or other air movement device or design (e.g., design of heat sinks, etc.).

At 206, the door filter assembly 114 may be coupled to the electronic device housing 104, possibly into at least one feature used to secure the security door 110 in the closed position. The door filter assembly 114 may couple to the electronic device housing 104 over or about the aperture 108. In some embodiments, the door filter assembly 114 may be coupled to the electronic device housing 104 while the door filter case 116 is in a first position that reveals the display, which may provide access to coupling features of the filter assembly 114 and/or the electronic device housing 104 used for the coupling.

At 208, the door filter casing 116 may be moved or otherwise rotated from the first position (shown with respect to the operation 206) to a second position where the air filter 120 is adjacent to and covers the display 106. In the second position, air entering the electronic device 102 may have to pass through the air filter 120, which may remove particulates, dirt, and/or other unwanted substances from entering the electronic device. Exposure by internal parts of the electronic device to particulates, dirt, and/or other unwanted substances may compromise operation of the electronic device over time. The door filter casing may lock or secure into the second position using a feature that engages a corresponding feature of the door filter frame 118.

As discussed above, the operations 202-208 may be performed in reverse order to remove the door filter assembly 114 from the electronic device 102 and prepare the electronic device for shipment by closing the security door 110. During operation of the electronic device 102, or at other times, a user may toggle between the operations 206 and 208 to filter air when possible, while occasionally viewing the display 106, which may be a touch screen display that include user interface controls configured for user interaction.

Figure 3A:
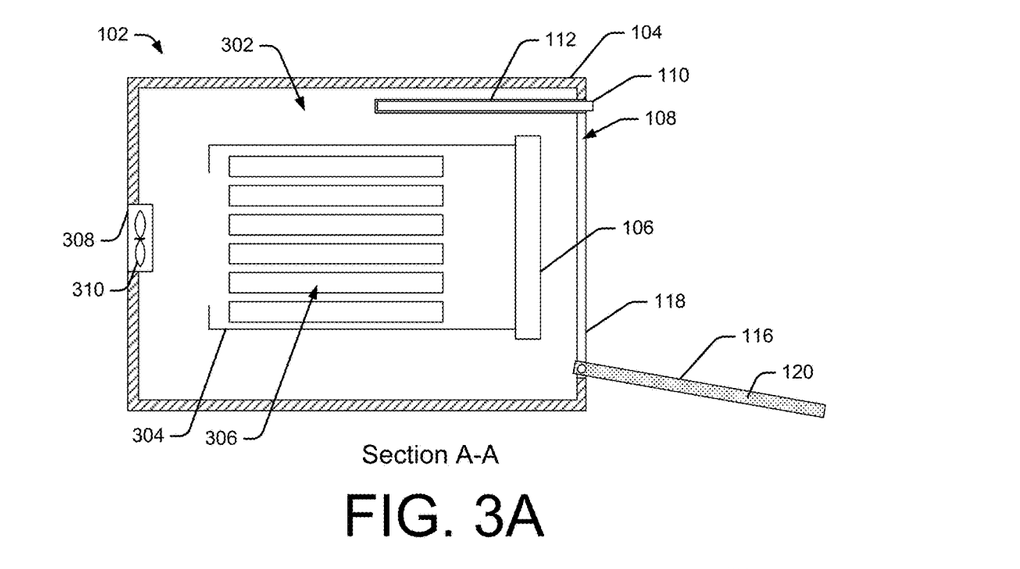
FIG. 3A shows the door filter in an open position to enable view of the display.

FIG. 3A shows a cross-sectional side elevation view of the electronic device 102 along cross section A-A from FIG. 1. FIG. 3A shows the door filter casing 116 in an open position to enable view of the display 106. As shown, an internal volume 302 of the electronic device housing 104 may include a frame 304. The display 106 and/or components 306 may be securely coupled to the frame 304. In some embodiments, the components 306 may be persistent storage. The persistent storage may include any type of storage such as, but not limited to hard disk drives, optical media, magnetic tapes, memristor storage, persistent RAM or solid state storage devices. The electronic device 102 may include one or more vents 308 or other air outlet to enable air to exhaust from the electronic device 102. An air movement mechanism 310 may cause air to move through the electronic device in a particular direction, such an input through the aperture 108, past the components 306 to extract heat from the components 306, and out through the one or more vents 308. The one or more vents 308 may be one directional vents to substantially prevent particles from entering the volume 302 of the electronic device 102 while enable air to exit the electronic device 102. The air movement mechanism 310 may include a fan or other air movement components (e.g., fins, valves, etc.).

Figure 3B:
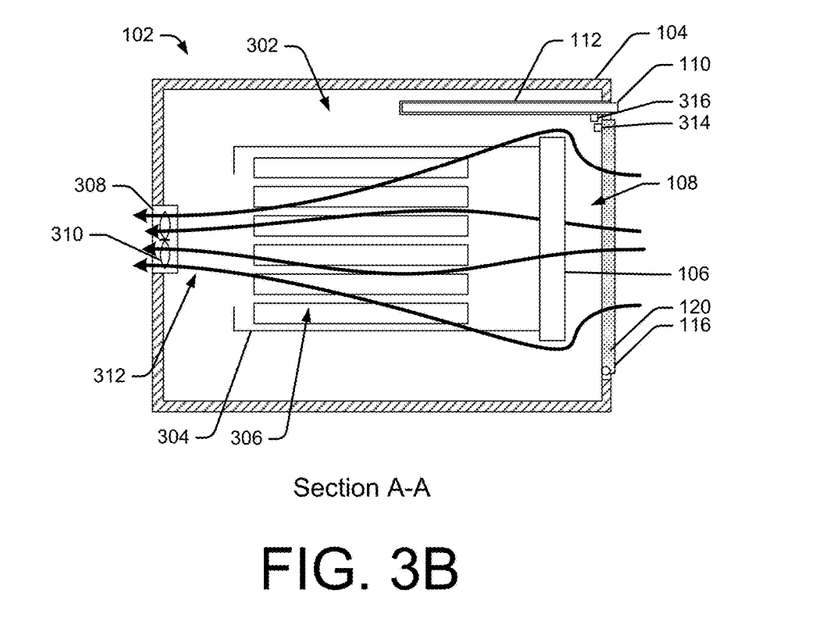
FIG. 3B shows the door filter in a closed position to filter air entering the electronic device.

FIG. 3B shows a cross-sectional side elevation view of the electronic device 102 along cross section A-A from FIG. 1, and shows airflow 312 (depicted by dark lines) of a cooling system of the electronic device 102 that moves air through the air filter 120 and through the electric device 102. FIG. 3B shows the door filter casing 116 in the closed position to cause air entering the electronic device to flow through the air filter 120 prior to entering the electronic device 102 via the aperture 108. The air may flow through aperture 108 through one or more gaps between the display 106 and the electronic device housing 104 or other components inside the electronic device housing 104. The air, now filtered, may extract heat from the components 306 during operation of the electronic device.

In some embodiments, the door filter casing 116 may include a first feature 314 while the electronic device 102 may include a corresponding feature 316 that can detect the presence of the first feature 314 when the door filter casing 116 is in the second position. For example, the first feature 314 may depress the second feature 316, such as a mechanical switch, that senses this depression. As another example, the first feature 314 may be magnetized and the second feature 316 may operate to detect presence of a magnetic force. In another example, the first feature 314, when proximate to the second feature 316, may complete an electrical circuit (or possibly disconnect an electrical circuit), which may indicate a location of the first feature 314 with respect to the second feature 316. The interoperation of the first feature 314 and the second feature 316 may enable to electronic device 102 to determine when the air filter 120 is filter air, how long the air filter has been used, and/or other information, which may possibly be used to control operation of the electronic device 102. For example, the electronic device 102 may not activate the air movement mechanism 310, may provide visual or audible alerts, and/or may perform other operations based on information obtained or sensed via the first feature 314 and/or the second feature 316.

Figure 4:
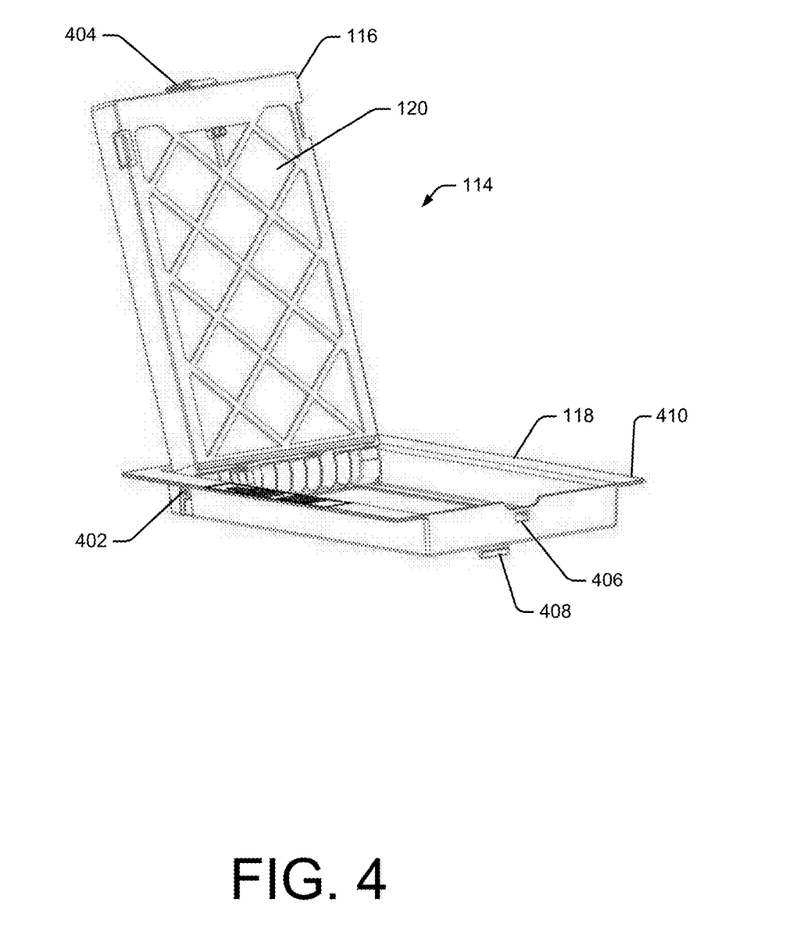
FIG. 4 is a perspective view of a door filter assembly shown in an open position. The door filter assembly may include a door filter frame and a door filter casing.

FIG. 4 is a perspective view of the door filter assembly 114 shown in an open position (or first position). The door filter assembly 114 includes the door filter casing 116 and the door filter frame 118. In some embodiments, the door filter casing 116 may rotate about a hinge 402. The door filter casing 116 may include a first coupler 404 that removably engages or couples to a second coupler 406 on the door filter frame 118. In some embodiments, the door filter frame 118 may include a coupling feature 408 that couples to a coupling feature of the electronic device housing 104, such as a coupling feature also used to secure the security door 110 to the electronic device housing 104. The door filter frame 118 may include a flange 410, which may seat the door filter frame 118 in a specific location relative to the electronic device housing 104 during mating and/or may reduce airflow around the air filter 120 by preventing airflow from bypassing the air filter 120 when the door filter casing 118 is in the second position.

Figure 5A:
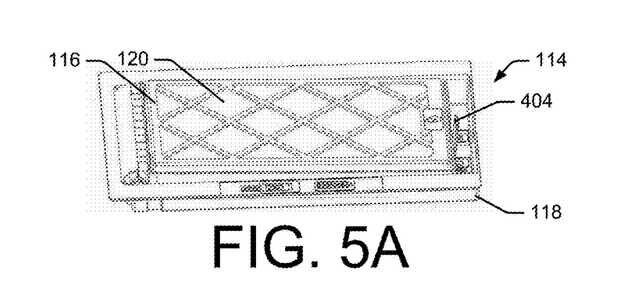
FIG. 5A is a pictorial view.
Figures 5B, 5E:
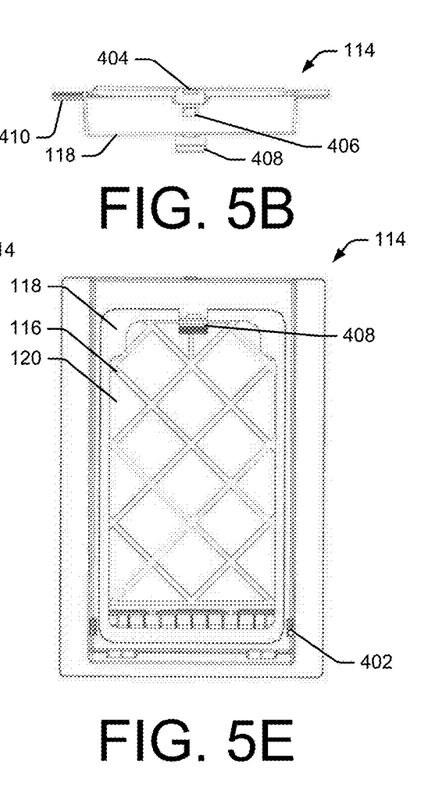
FIG. 5B is a top plan view.
FIG. 5E is a back elevation view.
Figure 5C:
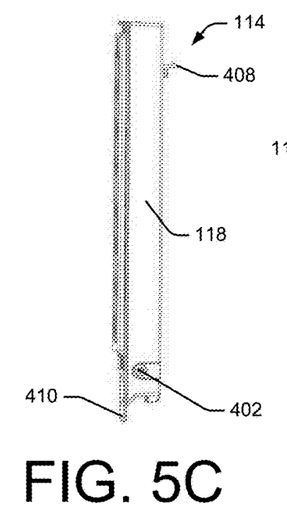
FIG. 5C is a right side elevation view, FIG. 5D front elevation view
Figure 5D:
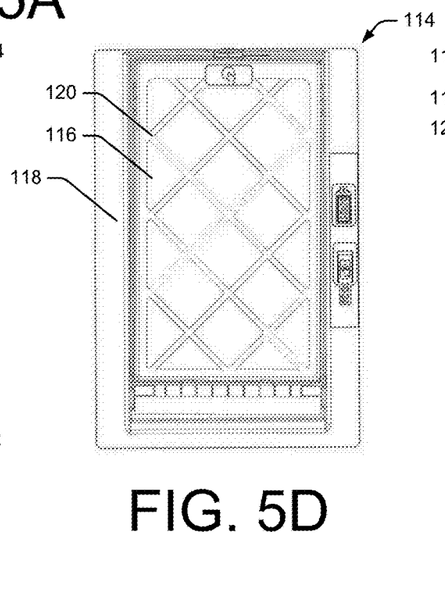

FIGS. 5A-E show the door filter assembly 114. FIG. 5A is a pictorial view of the door filter assembly 114. FIG. 5B is a top plan view of the door filter assembly 114. FIG. 5C is a right side elevation view of the door filter assembly 114. FIG. 5D front elevation view of the door filter assembly 114. FIG. 5E is a back elevation view of the door filter assembly 114. In some embodiments, the door filter casing 116 may eject or be otherwise moveable relative to the door filter frame 118 rather than or in addition to being movable by rotation. In various embodiments, the door filter casing 116 may be coupled to and/or integrally formed with the door filter frame 118. For example, the door filter casing 116 may include features that cause the door filter casing 116 to couple directly to the electronic device housing 104 without use of another part.

Figure 6A:
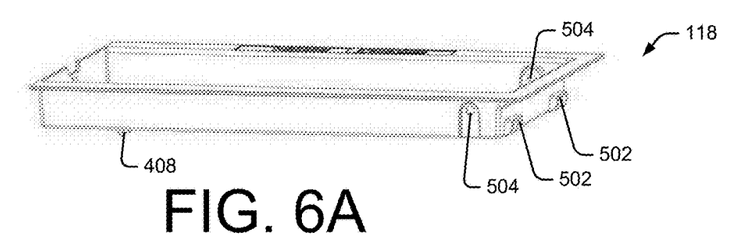
FIG. 6A is a pictorial view.

FIGS. 6A-E show the door filter frame 118. FIG. 6A is a pictorial view of the door filter frame 118 that includes engagement features 502 to engage the electronic device housing 104 when inserting the door filter frame 118 into the electronic device housing 104. The engagement features 502 may engage same features on the electronic device housing 104 that are engaged by the security door 110 when the security door 110 is in the closed position. The door filter frame 118 may include apertures or hinge features 504 to engage the hinge 402 shown in FIG. 5C, which enable the door filter casing 116 to rotate.

Figure 6B:
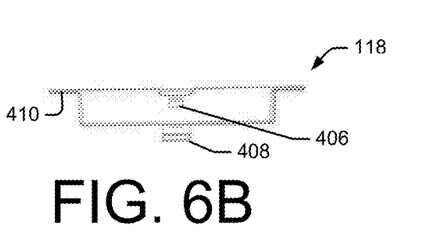
FIG. 6B is a top plan view.
Figure 6C:
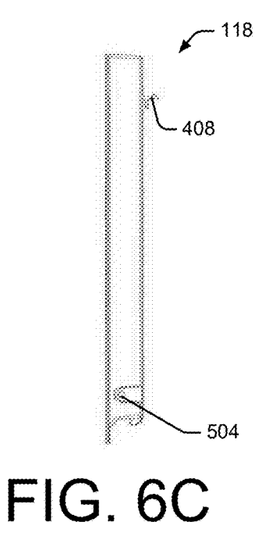
FIG. 6C is a right side elevation view, FIG. 6D front elevation view
Figure 6D:
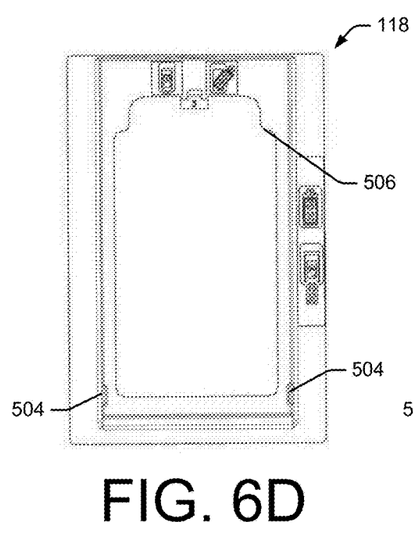
Figure 6E:
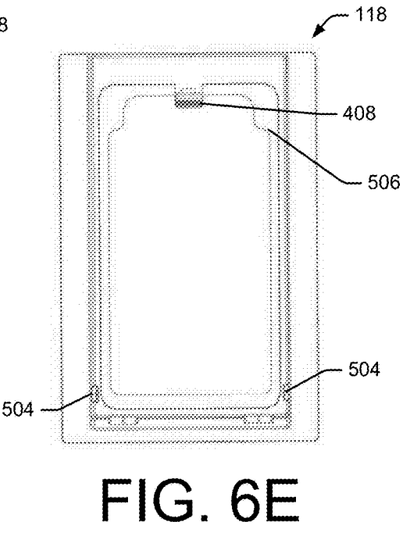
FIG. 6E is a back elevation view.

FIG. 6B is a top plan view of the door filter frame 118. FIG. 6C is a right side elevation view of the door filter frame 118. FIG. 6D front elevation view of the door filter frame 118 that includes an aperture 506 to enable air to flow through the door filter frame 118 and enter the electronic device 102 when the door filter frame 118 is coupled to the electronic device housing 104. FIG. 6E is a back elevation view of the door filter frame 118.

Figures 7A, 7B, 7C, 7D, 7E:
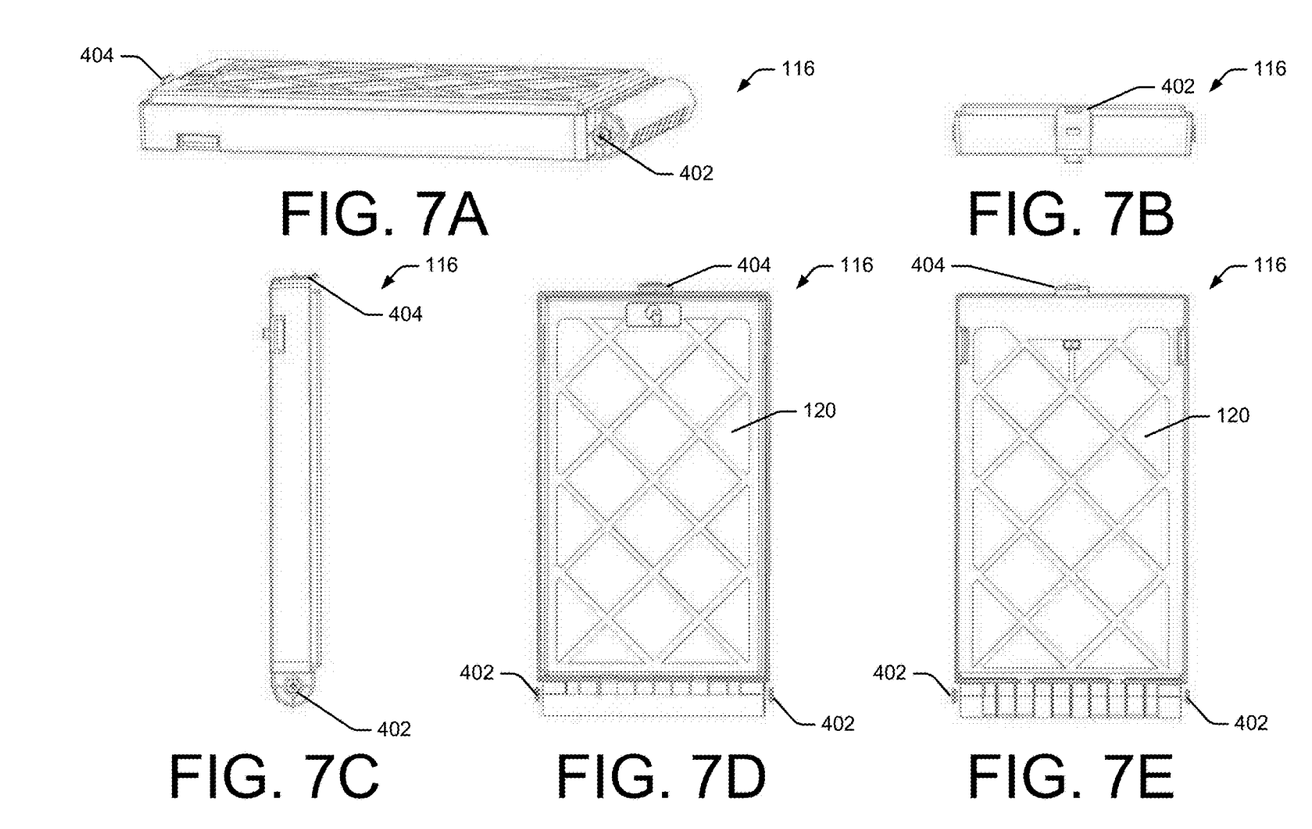

FIGS. 7A-E show the door filter casing 116. FIG. 7A is a pictorial view of the door filter casing 116. FIG. 7B is a top plan view of the door filter casing 116. FIG. 7C is a right side elevation view of the door filter casing 116. FIG. 7D front elevation view of the door filter casing 116. FIG. 7E is a back elevation view of the door filter casing 116. In some embodiments, the door filter casing 116 may be formed as a single piece that includes the air filter 120, such as when the door filter casing 116 is a one-time-use part intended to be discarded after use. However, the door filter casing 116 may include multiple parts and may be intended for multiple-use, such as by enabling replacement of the air filter 120 while retaining at least some parts of the door filter casing 116. An example of a reusable version of the door filter casing 116 is provided next.

Figure 8:
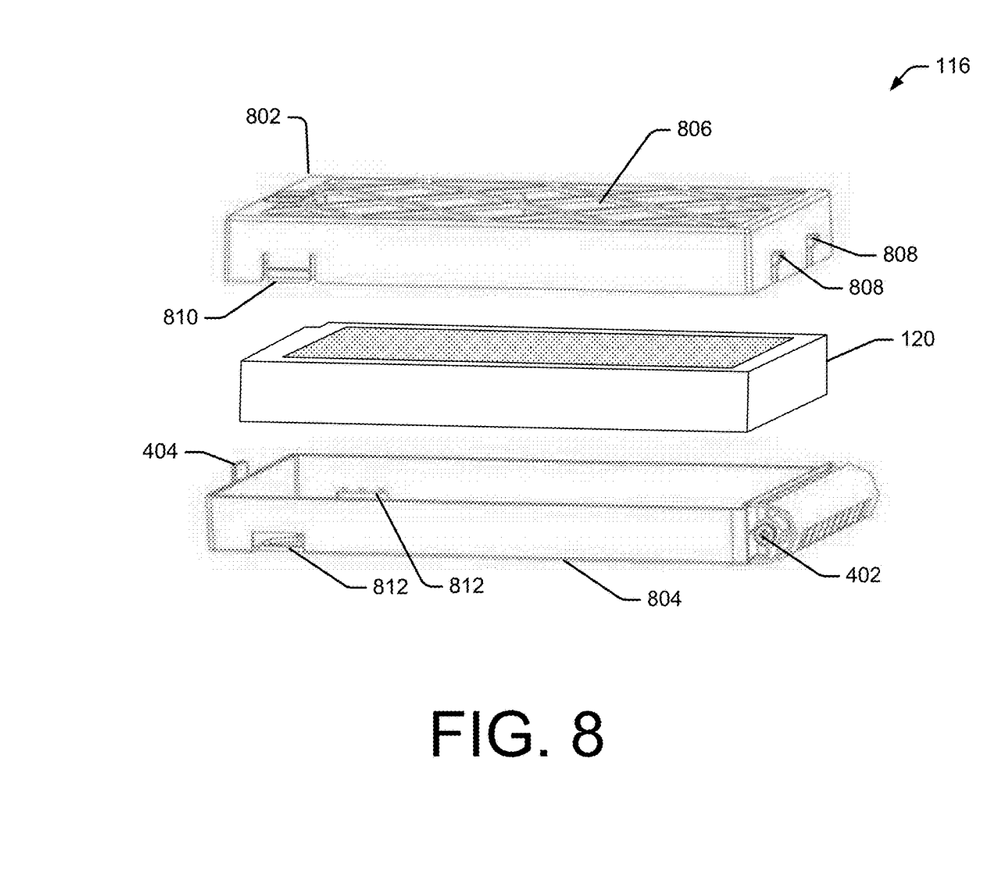
FIG. 8 is perspective exploded view of the door filter casing that includes a filter.

FIG. 8 is perspective exploded view of the door filter casing 116 that includes the air filter 120 to enable removal and replacement of the air filter 120. The door filter casing 116 may include a first portion 802 to mates with a second portion 804 to at least partially enclose or secure the air filter 120. The first portion 802 and the second portion may include apertures 806 to enable air to pass through the respective portion and into/through the air filter 120. The first portion may include features 808 that engage into corresponding features of the second portion 804 to secure the first portion 802 to the second portion 804. The first portion 802 may include first couplers 810 that removable couple to second couplers 812 (e.g., apertures, recess, or other features) located on the second portion 804. Thus, the first portion 802 may be coupled to the second portion 804 by way of engagement of the first couples 810 and the second couplers 812, as well as the features 808 that may engage corresponding features in the second portion. These couplers/features may enable disassembly of the first portion 802 from the second portion 804, for example, to access and/or replace the air filter 120, such as when the air filter becomes dirty and/or fails to allow adequate air to pass through the air filter 120.

Figure 9A:
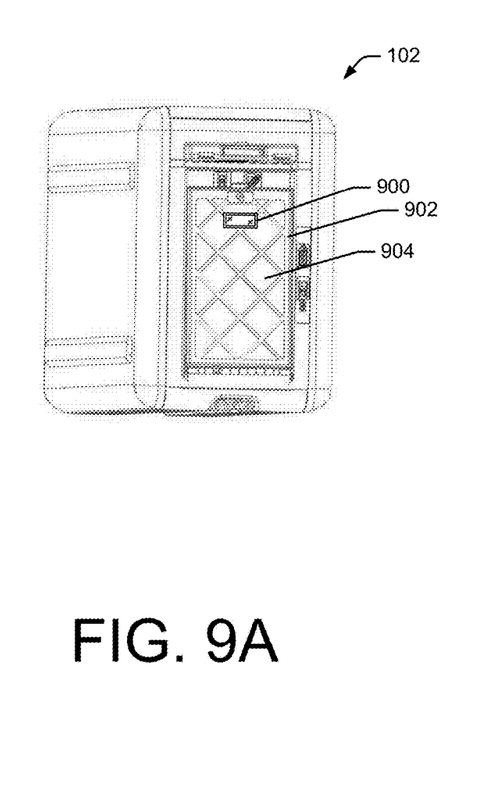
FIG. 9A is a perspective view of the electronic device with the optical indicator component.
Figure 9B:
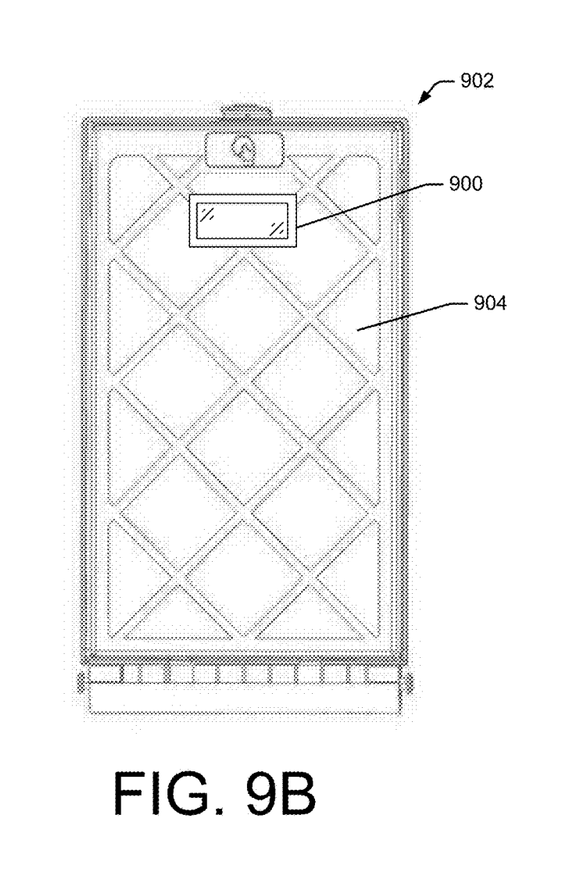
FIG. 9B is a front elevation view of the door filter casing with the optical indicator component.

FIGS. 9A and 9B show an illustrative optical indicator component 900 to provide messages to a user of the electronic device. FIG. 9A is a perspective view of the electronic device 102 with the optical indicator component 900 included in a door filter casing 902 that includes an air filter 904. The optical indicator component 900 may be a light pipe, a prism, and/or any other optical device that enable light to pass through or substantially through the optical indicator component 900 and be perceivable by a user. The optical indicator component 900 may be formed of glass, or a polymer or any other material providing a clear, transparent, or opaque substance to permit light to pass at least partially through the optical indicator component 900. The light that passes through the optical indicator component 900 may originate or be provided by a display (e.g., the display 106 shown in FIG. 1) or another light source (e.g., light emitting diode (LED), etc.) located behind and adjacent to the door filter casing 902 as shown in FIG. 9A. During operation, the optical indicator component 900 may enable information from the display to be perceived by a user. For example, specific portions of the display (e.g., numbers, characters, colors of light, flashes of light, etc.) may be emitted through the optical indicator component 900 and may be visible to a user to provide information to the user, such as information about operation of the electronic device 102. As a simple, example, colored light may be emitted through the optical indicator component 900 such that green light indicates normal operation, yellow light indicates that the device is performing an operation, and red light indicates a fault or error. Of course, many different codes could be used that rely on colors, pulses of light, and/or other light sequences and/or variations.

FIG. 9B is a front elevation view of a door filter casing 902 that includes the optical indicator component 900. The air filter 904 may include an aperture to enable placement or coupling of the optical indicator component 900 in the door filter casing 902. In some embodiments, the optical indicator component 900 may be coupled to the air filter 904. In various embodiments, the optical indicator component 900 may be coupled to the first portion or second portion of the door filter casing.

Figure 10A:
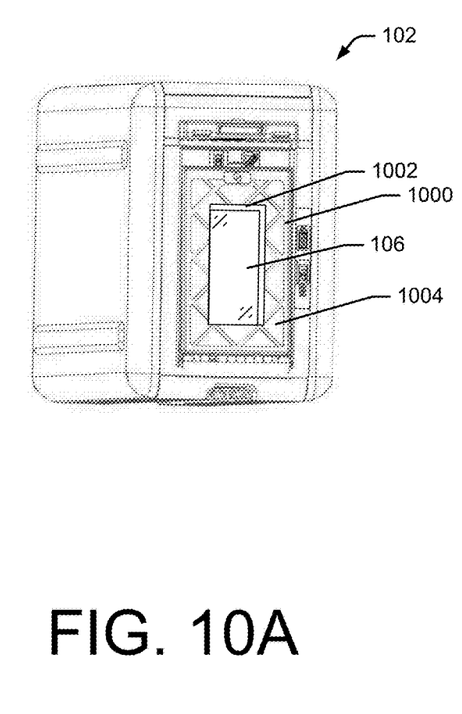
FIG. 10A is a perspective view of the electronic device with the door filter casing that includes the aperture.

FIG. 10A is a perspective view of the electronic device 102 with a door filter casing 1000 that includes a display aperture 1002 (or window). The display aperture 1002 may allow a user to view at least a portion of the display 106 while the door filter casing 1000 is in the second position and positions an air filter 1004 in a path of airflow entering the electronic device. The air filter 1004 may recess along the side of the display 106 and into a cavity around the perimeter of the display. When the door filter casing 1000 is in the second position, a front surface (outward facing surface) of the display 106 may be coplanar or near coplanar with a front side of the door filter casing 1000.

Figure 10B:
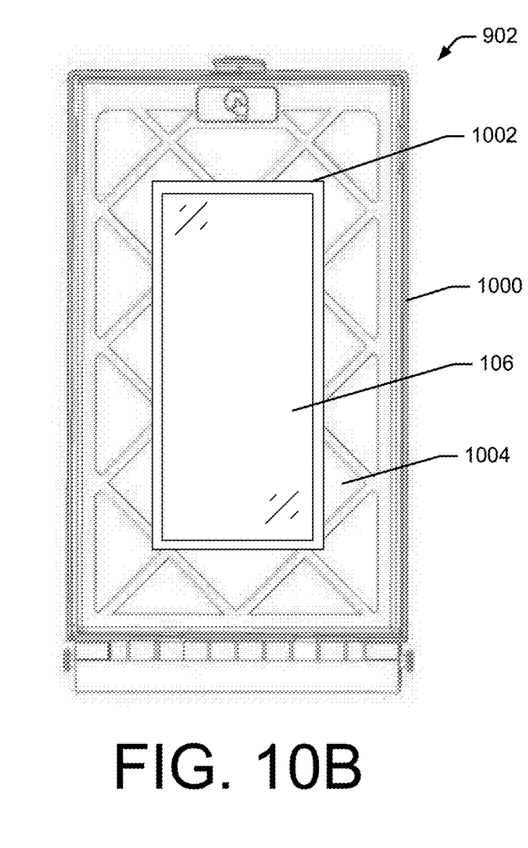
FIG. 10B is a front elevation view of the door filter casing that includes the aperture.

FIG. 10B is a front elevation view of the door filter casing that includes the display aperture. In some embodiments, the door filter casing may cover a portion of the display such that a portion of the display is covered by the air filter 1004 or the door filter casing 1000. This overlap may prevent debris from entering the electronic device. In various embodiments, the display aperture 1002 may include a window, such as a plastic cover or glass cover that is transparent to prevent airflow through the window aperture 1002 but allow visibility of the portion of the display 106. In various operations, when a portion of the display 106 is covered by the door filter casing 1000, the electronic device may detect the covering (e.g., the presence of the door filter casing 1000 proximate to the display 106) and may adjust the display output accordingly, such as to limit display to an area visible through the display aperture 1004. The electronic device may detect the presence of the door filter casing 1000 proximate to the display 106 using an ambient light sensor that detects blockage of light by the door filter casing 1000, by a hall effect sensor or other magnetic sensor, completion of an electrical circuit (or disconnection of an electrical circuit), by a mechanical switch, and/or using other sensors or devices. Operation of the display 106 is described below with reference to FIG. 12.

Figure 11A:
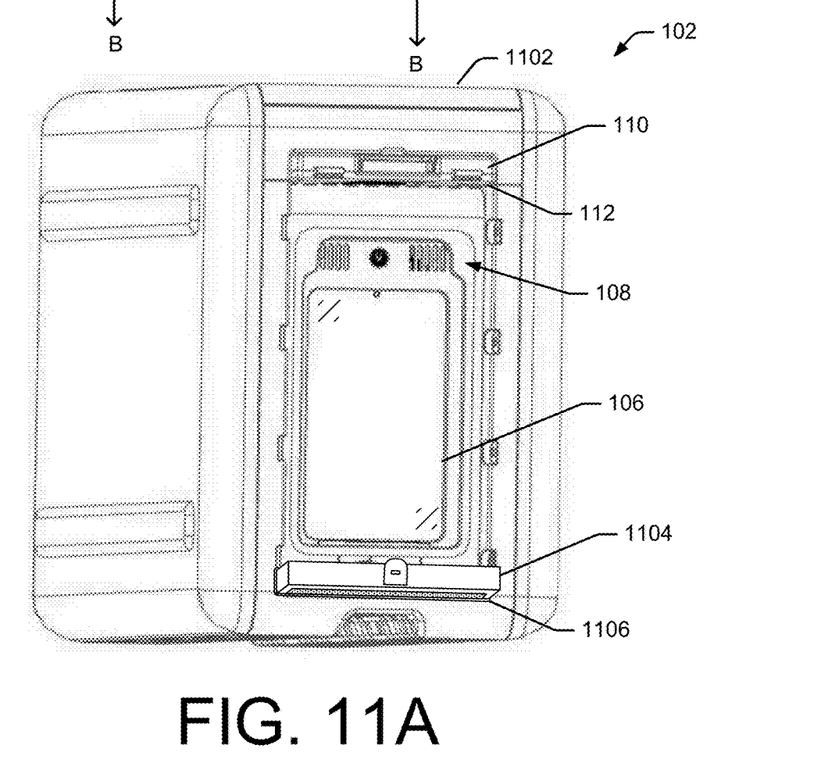
FIG. 11A is a perspective view of the electronic device.
Figure 11B:
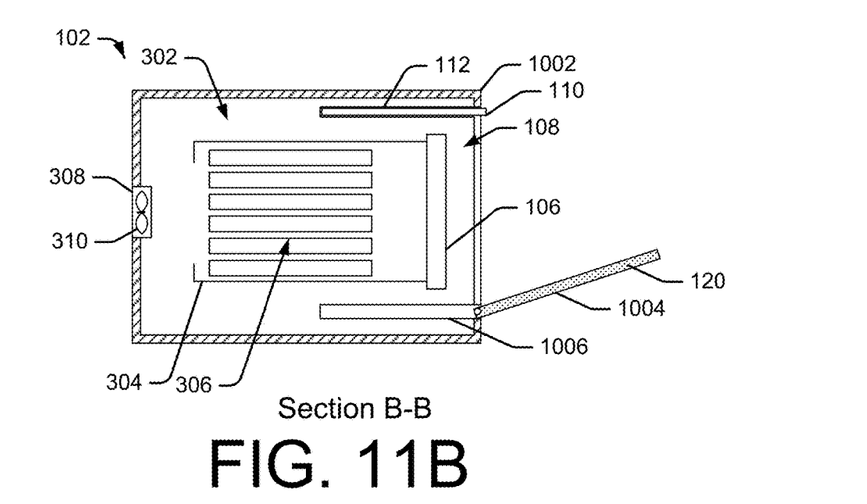
FIG. 11B is a cross-sectional view of the electronic device housing.

FIGS. 11A and 11B show the electronic device 102 with a stowable door filter and stowable security door, which each stow in an electronic device housing 1102. FIG. 11A is a perspective view of the electronic device 102. The electronic device 102 may include the security door 110 that may stow in a cavity 112 of the electronic device housing 1102 when not in use, such as when not used to secure the electronic device 102 during shipment of the electronic device 102. The electronic device 102 may include a door filter casing 1104 that may stow in a filter cavity 1106 of the electronic device housing 1102 when not in use to filter air entering the aperture 108 of the electronic device 102. During shipment of the electronic device 102, the door filter casing 1104 may be stowed in the filter cavity 1106 and the security door 110 may be in the closed position to secure the electronic device and prevent user access to the display 106.

FIG. 11B is a cross-sectional view of the electronic device housing. The door filter casing 1004 may be coupled to the electronic device housing 1102 during transition between the first position (stowed position) and the second position where the door filter casing 1004 is proximate to the display and the air filter 120 filters air entering the aperture 108 of the electronic device. The door filter casing 1004 may be disassembled to remove the air filter as shown and discussed with respected to FIG. 8. For example, the air filter 120 may be replaced when the door filter casing 1004 is in an intermediate location between the first position and the second position that enables removing a first portion of the door filter casing 1004 from a second portion of the door filter casing 1004 to access and remove/replace the air filter 120.

Figure 12:
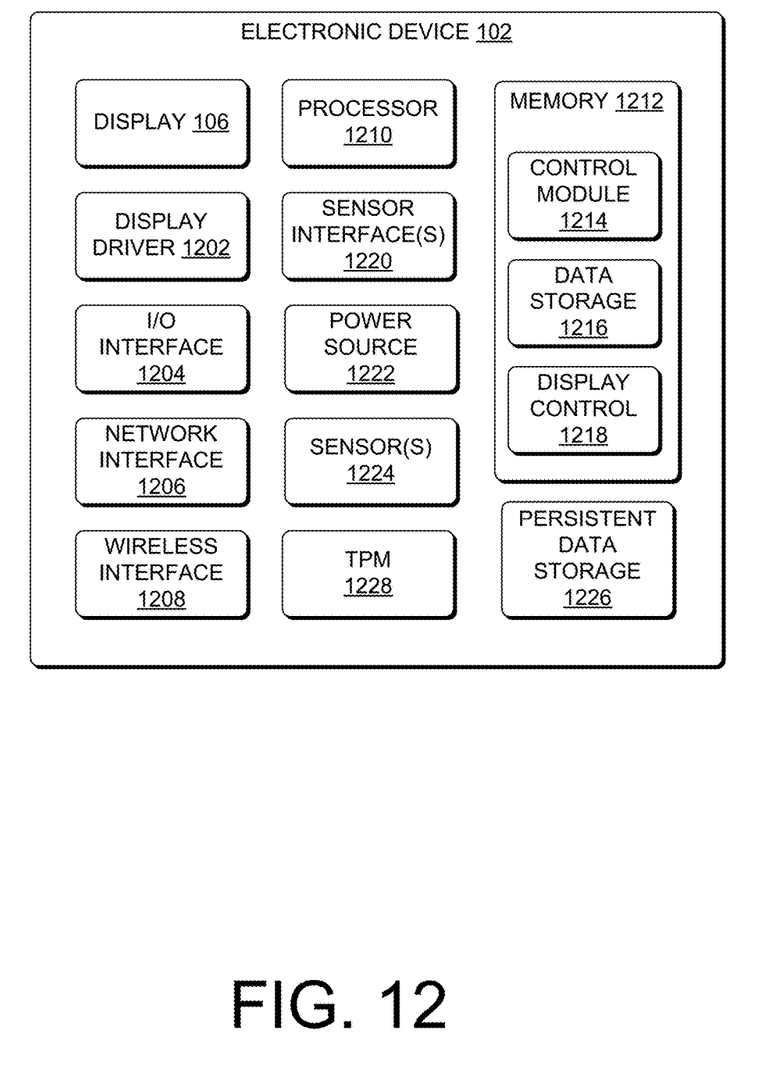
FIG. 12 is a logical block diagram of an illustrative electronic device.

FIG. 12 is a logical block diagram of an illustrative electronic device, such as the electronic device 102. FIG. 12 illustrates various components and modules of a shippable storage device. The electronic device 102 may be configured with fewer or additional components or modules. Some component or module may be replaced by other component or modules. For example, a processor 1210 and memory 1212 may be replaced by firmware, in embodiments. Various components or modules may perform some or all of the processes illustrated in the Figures, in embodiments.

In FIG. 12, the electronic device 102 is illustrated with the display 106, a network interface 1206 and persistent storage 1226. In the illustrated embodiment, a display driver 1202 provides an interface function between the processor 1210 and the display 106. For example, to instruct the display 106 to display a user interface and/or controls or progress information, processor 1210 executes computer instructions from the memory 1212 that send messages to the display driver 1202 that are interpreted by the display driver and cause the display driver to display the information on the display 106.

A network interface 1206 acts as an interface between an external network (e.g., a customer network or a service provider network or network) and the electronic device 102. In embodiments, the network interface 1206 is configured to transmit instructions to the electronic device or to transmit encrypted data to the persistent storage 1226. A wireless interface 1208 may be configured to receive (e.g., via cellular or Wi-Fi network) instructions from a service provider or other device.

An Input/Output (I/O) interface 1204 may be configured to coordinate I/O traffic between the processor 1210, the memory 1212, the display driver 1202, the network interface 1206, the wireless interface 1208, the sensor interface(s) 1220 and the persistent storage 1226 or peripheral interface. In some embodiments, the I/O interface 1204 may perform any necessary protocol, timing or other data transformations to convert data signals from one component (e.g., the system memory 1212) into a format suitable for use by another component (e.g., the processor 1210). In some embodiments, the I/O interface 1204 may include support for devices attached through various types of peripheral buses, such as a variant of the Peripheral Component Interconnect (PCI) bus standard or the Universal Serial Bus (USB) standard, for example. In some embodiments, the function of the I/O interface 1224 may be split into two or more separate components, such as a north bridge and a south bridge, for example. Also, in some embodiments, some or all of the functionality of the I/O interface 1204, such as an interface to system memory 1212, may be incorporated directly into processor 1210.

The memory 1212 may store computer executable instructions that, when executed by the processor 1210, cause the processor to perform various functions. The memory 1212 may include a control module 1214 to control operation of the device, possibly including power management and other operations. The memory 1212 may include data storage 1216 to control and monitor storage and use of the persistent data storage 1226, for example. The memory 1212 may include a display control 1218. The display control 1218 may receive sensor information from the sensor(s) 1224 to detect that the door filter casing is in the second position, which may prompt the display control 1218 to cause the display 106 to output (display) in a different format, in a particular portion of the display such as a reduced portion that aligns with the optical indicator component 900 shown in FIG. 9 or the window aperture 1002 shown in FIG. 10. In this way, the display control 1218 may cause the display 106 to provide information to a user in a first way when the door filter casing is in the first position and in a second way (e.g., reduced display area) when the door filter casing is in the second position.

The electronic device 102 is depicted with the persistent data storage 1226. The persistent data storage 1226 may include any combination of non-volatile storage such as hard drives or flash memory. The persistent storage 1226 may be configured (e.g., during a provisioning process) to store large amounts of encrypted data (e.g., from a large data store such as a customer storage system) during shipment from the customer location to a service provider location where the data is transferred to a service provider storage system.

The electronic device 102 is depicted with power source 1222 that may power the various electronic components of the electronic device 102 and with the sensor(s) 1224 and the sensor interface(s) 1220. As described above, any of various sensor(s) may be incorporated into the electronic device 102. The electronic device 102 may also include various sensor interface(s) 1220 that act as an interface between the sensor(s) 1224 and the I/O interface 1204. The sensor interfaces may be proprietary interfaces, customized for a particular sensor, in embodiments. The sensor interfaces may perform various functions such as conversions of data, analysis of sensor output and output of information based on the analysis or the like.

The electronic device 102 is also depicted with a trusted platform module (TPM) 1228. The TPM 1228 may provide additional security features for the electronic device 102. For example, after a storage service provider receives a TPM 1228 from a customer, the storage service provider may communicate with the TPM 1228 to determine whether a change has been made to the configuration of the electronic device 102. Changes to the electronic device 102 configuration may indicate that the shippable storage device 100 was tampered with and that a third party may have accessed data on the electronic device 102.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. An electronic device comprising:
   an electronic device housing that includes a frame to couple components of the electronic device, the electronic device housing configured to protect the electronic device during a shipment of the electronic device, the electronic device including an aperture to enable airflow into the electronic device;
   a display coupled to the frame and recessed within the aperture of the electronic device housing;
   a security door to selectively move between a closed position to cover the aperture when the electronic device is configured for the shipment and a stowed position where the security door is stowed in the electronic device housing enabling airflow into the electronic device and access to the display; and
   a door filter assembly to selectively couple to the electronic device housing when the security door is in the stowed position, the door filter assembly comprising:
      a door filter frame configured to couple to the electronic device housing; and
      a door filter casing configured to rotate from a first position to reveal the display to a second position to cover the aperture with an air filter configured to filter air flowing into the electronic device.

2. The electronic device as recited in claim 1, wherein the door filter casing includes a first portion that removably couples to a second portion of the door filter casing to at least partially enclose the air filter and to enable replacement of the air filter.

3. The electronic device as recited in claim 1, wherein the door filter casing includes a filter aperture that extends through the air filter and through the door filter casing to enable visibility of a portion of the display through the filter aperture while the door filter casing is located in the second position, the air filter to filter air flowing into the electronic device that travels through the aperture and around the display.

4. The electronic device as recited in claim 1, wherein the door filter casing includes a prism or light pipe that extends through the air filter and the door filter casing to enable light from the display to be projected outside of the door filter casing while the door filter casing is located in the second position.

5. The electronic device as recited in claim 1, wherein the door filter casing includes at least a first component to indicate that the door filter casing is in the second position, the first component being a mechanical switch, a magnet, or a portion of an electrical circuit.

6. The electronic device as recited in claim 1, wherein the door filter frame includes a first feature that couples to a corresponding second feature of the electronic device housing when the door filter frame is coupled to the electronic device housing, and wherein the security door includes a third feature that couples to the corresponding second feature when the security door is in the closed position.

7. A door filter to selectively couple to a device housing of an electronic device, the door filter comprising:
   a door filter frame configured to couple to the device housing, the door filter frame including a coupling feature to removably couple to the device housing and a hinge feature to couple to a hinge, the door filter frame including a frame aperture that at least partially aligns with a device aperture of the device housing; and a door filter casing configured to couple to the door filter frame via the hinge that engages the hinge feature of the door filter frame, the door filter casing configured to rotate between a first position to enable access through the device aperture and a second position to cover the device aperture with an air filter to filter air flowing into the device aperture.

8. The door filter as recited in claim 7, wherein the door filter casing includes a first portion that removably couples to a second portion to at least partially enclose the air filter.

9. The door filter as recited in claim 7, wherein the door filter casing includes:

a window aperture that extends through the filter and the door filter casing to enable visibility through at least a portion of the device aperture while the door filter casing is located in the second position; and a window that covers the window aperture and inhibits airflow through the window aperture while enabling visibility through the window and through the device aperture.

10. The door filter as recited in claim 7, wherein the door filter casing includes an optical indicator component that extends through the filter and the door filter casing to enable light from a light source to be projected outside of the door filter casing while the door filter casing is located in the second position.

11. The door filter as recited in claim 7, wherein the door filter casing includes at least a first component to indicate that the door filter casing is in the second position, the first component being a mechanical switch, a magnet, or a portion of an electrical circuit.

12. The door filter as recited in claim 7, wherein the door filter frame includes a flange that extends outward from and substantially parallel with a front surface of the door filter casing, the flange at least partially surrounding the door filter frame to inhibit airflow around the door filter frame when the door filter frame is coupled to the device housing.

13. An apparatus comprising:

a housing that includes a housing aperture to enable airflow into the housing;

a security door to selectively move between a closed position to cover the housing aperture and an open position where the security door allows airflow into the housing; and a door filter to selectively couple to the housing when the security door is in the open position, the door filter comprising:

a door filter frame to couple to the housing; and a door filter casing configured to rotate from a first position to enable access through the housing aperture to a second position to cover the housing aperture with a filter to filter air flowing into the housing.

14. The apparatus as recited in claim 13, wherein the door filter casing includes a first portion that mates with a second portion to at least partially enclose the filter.

15. The apparatus as recited in claim 13, wherein the door filter casing includes a component or sensor to indicate that the door filter casing is in the second position.

16. The apparatus as recited in claim 13, wherein the housing include a cavity to stow the door filter when the door filter is in the first position as a first stowed position, and wherein the door filter includes a coupling feature to prevent the door filter from being removed from the housing while transitioning between the first stowed position and the second position.

17. The apparatus as recited in claim 13, wherein the door filter frame includes a flange that extends outward from and parallel with a front surface of the door filter casing, the flange at least partially surrounding the door filter frame to inhibit airflow around the door filter frame when the door filter frame is coupled to the housing.

18. The apparatus as recited in claim 13, wherein the door filter frame includes a first feature that couples to a corresponding second feature of the housing when the door filter is coupled to the housing, and wherein the security door includes a third feature that couples to the corresponding second feature when the security door is in the closed position.

19. The apparatus as recited in claim 13, further comprising a display coupled to the housing and recessed within the housing aperture of the housing; and wherein the door filter casing includes a filter aperture that extends through the filter and the door filter casing to make a portion of the display visible through the filter aperture while the door filter casing is located in the second position, the filter to filter air flowing into the housing that travels through the housing aperture and around the display.

20. The apparatus as recited in claim 13, further comprising a display coupled to the housing and recessed within the housing aperture of the housing; and wherein the door filter casing includes an optical indicator component that extends through the filter and the door filter casing to enable light from the display to pass through the door filter casing while the door filter casing is located in the second position.

* * * * *